US007812755B2

(12) United States Patent
Vampola et al.

(10) Patent No.: US 7,812,755 B2
(45) Date of Patent: Oct. 12, 2010

(54) SIGNAL PROCESSOR WITH ANALOG RESIDUE

(75) Inventors: John L. Vampola, Santa Barbara, CA (US); Kenton T. Veeder, Burlington, MA (US)

(73) Assignee: Raytheon Company, Waltham, MA (US)

( * ) Notice: Subject to any disclaimer, the term of this patent is extended or adjusted under 35 U.S.C. 154(b) by 31 days.

(21) Appl. No.: 12/265,851

(22) Filed: Nov. 6, 2008

(65) Prior Publication Data

US 2010/0109925 A1 May 6, 2010

(51) Int. Cl.
*H03M 1/38* (2006.01)

(52) U.S. Cl. ........................ 341/161; 341/143; 341/155

(58) Field of Classification Search ................. 341/143, 341/155, 161
See application file for complete search history.

(56) References Cited

U.S. PATENT DOCUMENTS 4,786,831 A 11/1988 Morse et al.
5,461,425 A 10/1995 Fowler et al.
5,659,315 A * 8/1997 Mandl ........................ 341/143
5,844,514 A * 12/1998 Ringh et al. ................ 341/143
5,886,659 A * 3/1999 Pain et al. ................... 341/155
6,121,843 A 9/2000 Vampola et al.
6,665,013 B1 * 12/2003 Fossum et al. .............. 348/308
6,762,795 B1 7/2004 Chen et al.
6,825,877 B1 11/2004 Hewitt et al.
6,920,182 B2 * 7/2005 Bolton, Jr. .................. 375/247
6,927,796 B2 8/2005 Liu et al.
6,963,370 B2 11/2005 DiCarlo et al.
6,977,601 B1 12/2005 Fletcher et al.
7,095,439 B2 * 8/2006 Hammadou ................. 348/308
7,446,687 B2 * 11/2008 Lin ............................ 341/143
2002/0186776 A1 * 12/2002 Cosand ....................... 375/247
2003/0189657 A1 * 10/2003 Hammadou ................. 348/294
2008/0310221 A1 * 12/2008 Baker ...................... 365/185.2

OTHER PUBLICATIONS

Boyd Fowler, "CMOS Area Image Sensors with Pixel level A/D Conversion," Ph.D. thesis, Stanford University, Oct. 1995, 177 pp.

Kavusi, S., et al., "On incremental sigma-delta modulation with optimal filtering", IEEE Transactions on Circuits and Systems, Part 1: Regular Papers, vol. 53, No. 5, pp. 1004-1015 (2006).

(Continued)

*Primary Examiner*—Jean B Jeanglaude
(74) *Attorney, Agent, or Firm*—Pillsbury Winthrop Shaw Pittman LLP

(57) ABSTRACT

In one or more embodiments, an apparatus and method for processing an analog signal into a digital signal includes a quantizer that converts the analog signal, which can have any value within a given range of values, into a fixed set of discrete values. An analog residue, i.e. the quantization error caused by the difference between the analog value of the integrated analog signal and the closest corresponding discrete quantized value, is outputted. The analog residue can be further processed to increase the accuracy of the A/D conversion. Multiple quantizer stages can be provided to perform A/D conversion of the analog signal over multiple integration periods, e.g. in multi-shot and time-delay integration applications. The analog signal may represent an image signal.

35 Claims, 6 Drawing Sheets

210

OTHER PUBLICATIONS

Kavusi, S., et al., "Quantitative study of high dynamic range sigma-delta-based focal plane array architectures", Proceedings of the SPIE, vol. 5406, pp. 341-350 (2004).
Kavusi, S., et al., "Architecture for high dynamic ranger, high speed image sensor readout circuits", Stanford University (2006).
Tyrrell, B., et al., "Design approaches for digitally dominated active pixel sensors: leveraging Moore's Law scaling in focal plane readout design", Proceedings of the SPIE, vol. 6900, 69000W (2008).
International Search Report and Written Opinion dated Mar. 31, 2010 of PCT/US2009/062338 filed Oct. 28, 2009 (10 pages).

* cited by examiner

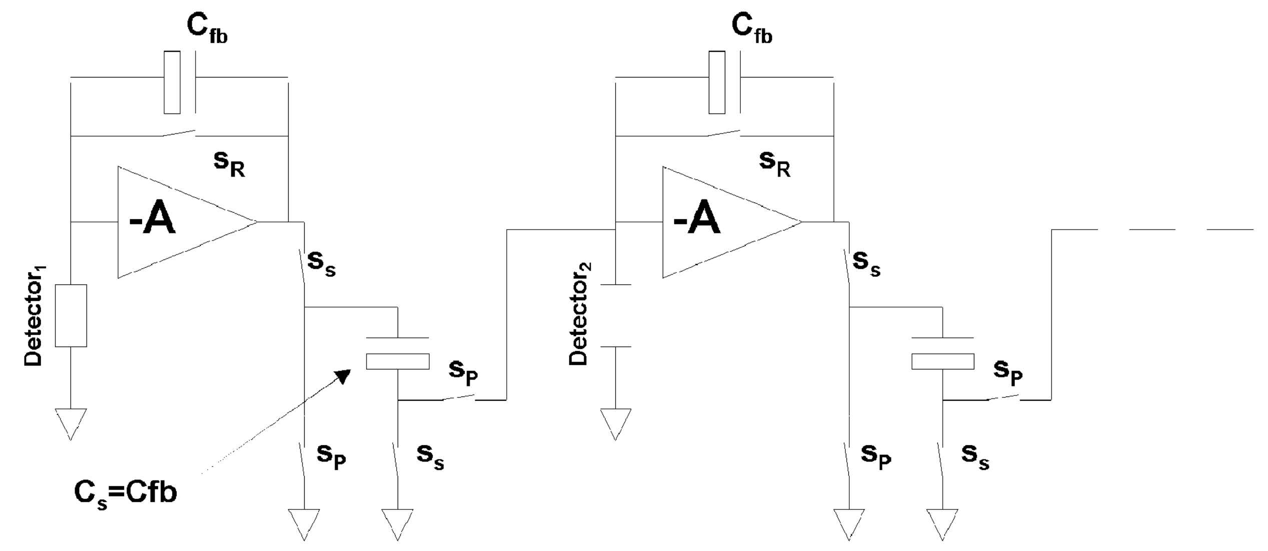

1) In integrate mode, $S_S$ switches are closed (shorted), $S_P$ and $S_R$ switches are open
2) To prepare to pass residue, $S_S$ is opened to isolate the values of the residue on $C_S$
3) The reset switches $S_R$ are closed (shorted) to reset the CTIA's
4) Reset switches $S_R$ are opened allowing the CTIAs to begin integration
5) The storage capacitor $C_s$ us then flipped and connected to the next detector via pass switches $S_P$
6) The residue from the capacitor is transferred to the CTIA feedback capacitor $C_{fb}$
7) Switches $S_P$ are opened and then $S_S$ closed to return to normal integration mode

FIG. 5B

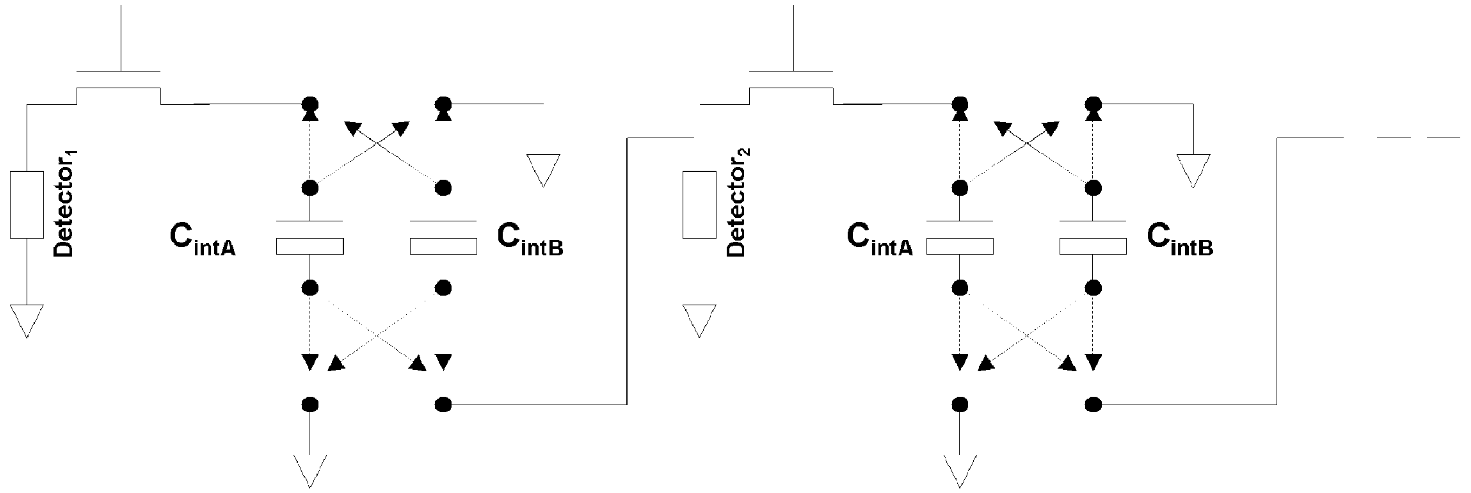

1) In integrate mode, $C_{intA}$ (or $C_{intB}$) connected to the output of each unit cell. $C_{intB}$ (or $C_{intA}$) are not connected and have no signal charge on them
2) To prepare to pass residue, $C_{intA}$ (or $C_{intB}$) is flipped and is ready to be connected across the input (detector) of the next pixel
3) $C_{intB}$ (or $C_{intA}$) is connected to the output of each pixel
4) $C_{intA}$ (or $C_{intB}$) is now connected across the detector of the next pixel in TDI.
5) $C_{intA}$ (or $C_{intB}$) is disconnected from the input of the next unit cell and is ready to take the place of $C_{intB}$ (or $C_{intA}$) during the next cycle.
6) Start the process with 1) above, but swap the names $C_{intA}$ and $C_{intB}$.

FIG. 5C

SIGNAL PROCESSOR WITH ANALOG RESIDUE

BACKGROUND

This disclosure relates to an apparatus and method for processing an analog signal into a digital signal, for example, in an image sensor.

An image sensor may comprise an array of photodetectors for imaging light focused onto the image sensor. Each photodetector may include a photodiode or phototransistor which generates charge in proportion to the intensity of light incident on the photodetector. The charge generated by the photodetector is stored in a charge well, e.g., on a capacitor. A clock synchronizes and controls the readout of the stored packets of charge from the charge wells, and an amplifier converts each packet of charge to a voltage. An analog-to-digital converter (ADC) further converts the analog value of each voltage into a corresponding digital value.

The ADC may be provided at chip-level, column-level, or pixel-level. A chip-level ADC performs analog-to-digital (A/D) conversion for all photodetectors in the image sensor array, a column-level ADC performs A/D conversion for the photodetectors in a single column or group of columns, and a pixel-level ADC performs A/D conversion for a single photodetector. Increasing the number of ADC's can increase the speed with which the A/D conversion is performed. However, providing more ADC's can result in an increase in the complexity and footprint of the necessary A/D conversion circuitry.

ADC's are conventionally implemented as complementary metal-oxide semiconductor (CMOS) devices. In contrast, image sensors may be implemented as charge coupled devices (CCD's) or CMOS devices. In a CCD, the packets of charge generated by each photodetector are transported through successive charge wells, i.e. in a bucket-brigade arrangement. A vertical shift register shifts the charge stored in each row in the image sensor array downward towards a horizontal shift register. The horizontal shift register then shifts out the charge stored in each successive row towards an amplifier. Typically, A/D conversion of CCD image data is performed off-chip, i.e. at chip-level, since the semiconductor processing required for conventional CMOS ADC's and CCD's is incompatible. In contrast, CMOS image sensors can more readily incorporate additional circuitry, e.g. pixel-level CMOS ADC's.

SUMMARY

According to various embodiments and aspects of this disclosure, a signal processor and an image sensor are provided which are compatible with conventional semiconductor processes, e.g. CMOS. In addition, the signal processor enables the image sensor to be read quickly with high dynamic range. For example, dynamic range can be increased using simple and inexpensive low dynamic range components by reducing noise and increasing the signal, e.g., by preventing saturation caused by the photodetectors and enabling more light to be captured from the scene over longer exposure periods.

In one or more aspects of this disclosure, the analog residue of an analog signal that has been quantized is retained for further processing to increase the accuracy of the final A/D conversion performed by a quantizer.

In one embodiment, a signal processor includes a signal processing unit that has an analog input configured to receive an analog input signal. A quantizer may be configured to quantize the received analog input signal into an integer number determined with respect to a predetermined value, and to output the integer number. The integer number may be a digital number. An analog output may be configured to provide an analog residue associated with the quantized analog input signal.

In another embodiment, a method for processing an analog signal includes receiving the analog signal; quantizing the analog signal into an integer number determined with respect to a predetermined value; outputting the integer number; and outputting an analog residue associated with the quantized analog signal.

In yet another embodiment, an image sensor includes an array of photodetectors; an analog input configured to receive an analog signal generated by a photodetector; a quantizer configured to quantize the analog signal into an integer number associated with a predetermined value, and to output the integer number; and an analog output configured to provide an analog residue of the quantized analog signal.

BRIEF DESCRIPTION OF THE DRAWINGS

FIGS. 5A-5C illustrate alternative embodiments of circuits that may be used for analog residue processing.

DETAILED DESCRIPTION

Figure 1:
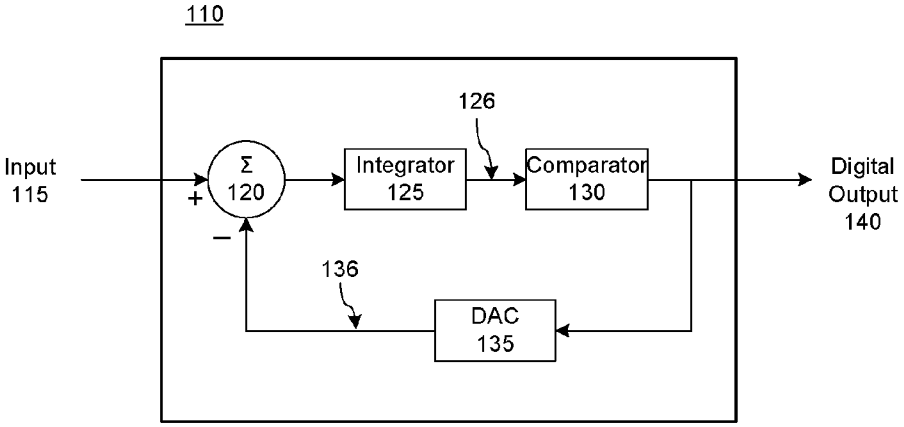
FIG. 1 shows a block diagram of a delta-sigma quantizer.

FIG. 1 shows a block diagram of quantizer 110 for quantizing analog input signal 115. Quantizer 110 can be configured, e.g. as a delta-sigma quantizer. During operation, quantizer 110 converts analog signal 115, which can have any value within a given range of values, into a quantized value. The quantized value is a discrete value within a fixed set of values.

Quantizer 110 can comprise summation node 120, which is configured to receive analog signal 115 and analog feedback signal 136 from digital-to-analog converter (DAC) 135. Integrator 125 integrates analog signal 115 over a period of time to produced integrated analog signal 126. Various implementations of integrator 125 are possible, e.g. integrator 125 can be configured as a capacitor for storing integrated analog signal 126.

Comparator 130 converts integrated analog signal 126 from integrator 125 into digital output signal 140. Various implementations of comparator 130 are possible, e.g. a single-bit ADC. Comparator 130 can be configured to output an integer number (or digital number), such as an increment, when integrated analog signal 126 reaches a threshold value within comparator 130. For example, comparator 130 can be configured to output a “1” if integrated analog signal 126 has reached the threshold value, or a “0” if integrated analog signal 126 has not reached the threshold value. Accordingly, comparator 130 can output a digital sequence of values, e.g. 0's and 1's, with a frequency proportional to the magnitude of integrated analog signal 126. By counting the number of pulses, the magnitude of integrated analog signal 126 can be determined.

Comparator 130 also provides analog feedback signal 136 to summation node 120 via DAC 135. For example, DAC 135 can be configured to convert the integer increment number associated with digital output signal 140 into analog feedback signal 136. DAC 135 can be implemented, for example, as a switched capacitor network. When DAC 135 is triggered, a fixed amount of charge 136 can be transferred to summation node 120. Accordingly, the amount of charge stored by integrator 125, corresponding to integrated analog signal 126, is reduced by an amount equal to the integer increment number outputted by comparator 130. As a result, integrated analog signal 126 is converted to digital output signal 140.

Due to its relative simplicity, quantizer 110 can be implemented within a small footprint. Thus, quantizer 110 can be incorporated within individual pixels of an image sensor having a large array of pixels and/or limited area. Performing A/D conversion within each pixel maintains the integrity of image data generated by the pixel. In particular, the analog signal generated within each pixel is prone to deterioration. By minimizing the distance the analog signal must be transmitted, less noise is introduced than when the analog signal is transported off-chip for A/D conversion.

Quantizer 110, however, does not retain the portion of integrated analog signal 126 that is less than the threshold value of comparator 130, and that remains after A/D conversion is complete. Accordingly, quantizer 110 has reduced sensitivity since this remaining portion, i.e. the analog residue, may be a relatively large portion of integrated analog signal 126. In some cases, analog input signal 115 may be so low that the threshold value within comparator 130 is not reached and the information of the entire analog input signal 115 is contained in the residue. The reduced sensitivity may be particularly evident when analog signal 115 is weak, or when the period of integration is short. Additionally, the loss of the analog residue can be compounded, for example, when an analog signal is integrated over multiple quantizer stages, as describe below. In particular, if an analog signal is integrated over a series of quantizers, the analog residue remaining after each stage of quantization is lost.

Figure 2:
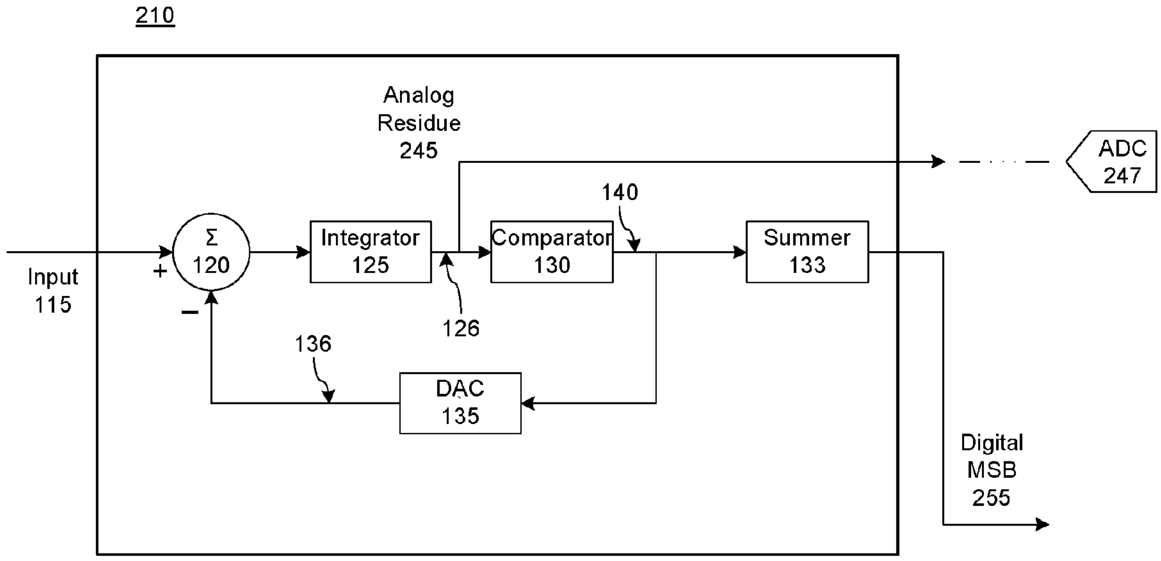
FIG. 2 shows a block diagram of a quantizer having an output for an analog residue.

FIG. 2 shows a block diagram of quantizer 210, which contains an output 245 for the analog residue remaining after quantization of analog signal 115. Quantization of analog signal 115 converts analog signal 115, which can have any value within a given range of values, into a fixed set of discrete values. Quantizer 210 can achieve high dynamic range with low dynamic range non-linear components. In addition, quantizer 210 is not dynamic range limited since analog signal 115 is continuously converted into the digital domain. As a result, for example, it is possible to prevent image sensor saturation.

The conversion of analog signal 115 into discrete values can cause quantization error, i.e. analog residue, when there is a difference between the analog value of integrated analog signal 126 and the closest corresponding discrete value of quantizer 210. Conventionally, the analog residue is disregarded and analog signal 115 is represented only by its quantized value. However, according to an embodiment, the analog reside of analog signal 115 can be captured and further processed to increase the accuracy of the A/D conversion performed by quantizer 210.

In an embodiment, quantizer 210 comprises summation node 120, integrator 125, comparator 130, and DAC 135, as described above with respect to FIG. 1. In particular, comparator 130 can output an integer increment number, such as "1", every time integrated analog signal 126 reaches a predetermined threshold voltage. Furthermore, analog residue 245, i.e. the portion of integrated signal 126 that is smaller than the threshold value and that is left after quantization, can be outputted. Accordingly, A/D conversion errors caused by the difference between the quantized and analog values of analog signal 115 can be eliminated by further processing analog residue 245.

Additionally, the configuration of quantizer 210 removes and compresses A/D conversion errors. For instance, errors caused by comparator 130 are preserved positively in digital output signal 140, and negatively in analog residue 245. As a result, these errors cancel when digital output signal 140 and analog residue 245 are later combined. In addition, errors created by DAC 135 are compressed through over-sampling of analog signal 115.

In various embodiments, analog residue 245 is outputted to successive quantizers for continued integration, or to ADC 247 for conversion into a digital value. It is recognized that a variety of implementations and types of quantizers can be used to quantize analog signal 115 and to provide analog residue 245.

The quantized value of analog signal 115, represented by digital most-significant-bits (MSB's) 255 is determined by summer 133. In various embodiments, summer 133 can be configured as an adder or a counter, for example. Summer 133 determines the total number of times integrated analog signal 126 reached the threshold value in comparator 130 by summing the integer increment numbers outputted by comparator 130. The quantized value of integrated analog signal 126, therefore, can be determined by multiplying the total number of times the threshold value was reached by the threshold value. In various embodiments, summer 133 can be configured as a serial shift register to output digital MSB's 255 for further processing or integration depending on an operation mode.

For example, an image sensor may be configured to perform single stage signal processing in "snap-shot" mode. In an embodiment, quantizer 210 can be provided for each photodetector in the image sensor. According to various embodiments, the photodetector can be configured as a photodiode, phototransistor, photoconductor, bolometer, or blocked impurity band detector, for example, which generates a signal from the light incident on the image sensor. The image senor can be exposed to a scene for a fixed period of time while integrator 125 integrates analog signal 115 generated by the photodetector. The intensity of light incident on the photodetector can be determined by combining digital MSB's 255 with the least-significant-bits (LSB's) generated from analog residue 245. In particular, digital MSB's 255, corresponding to the quantized portion of the image data signal, can be read out from summer 133. Furthermore, the LSB's corresponding to analog residue 245 of analog signal 115 can be generated by ADC 247. ADC 247 can be configured as a low dynamic range ADC since the range of analog residue 245 is limited to a value less than the threshold voltage. Accordingly, ADC is less costly to implement than a full resolution ADC. The value of each pixel can be determined by combining the MSB's and LSB's.

Quantizer 210 can also be the first stage in a multi-stage signal processing mode. For example, the image sensor can be further configured to capture and combine multiple images in both staring and scanning modes. In particular, the image sensor can generate a composite staring image by capturing and summing multiple exposures of a given scene over a period of time.

Furthermore, the image sensor can be configured as a scanning array for generating an image composed of multiple exposures of a moving subject. For example, time-delay integration (TDI) compensates for relative motion between the image sensor and the subject by shifting and combining image data for a plurality of individual exposures to cancel the relative motion. In other words, the image data generated by the photodetectors of an image sensor is shifted such that it remains stationary relative to the subject. The multiple exposures can be integrated and combined by using successive quantizer stages.

Figure 3:
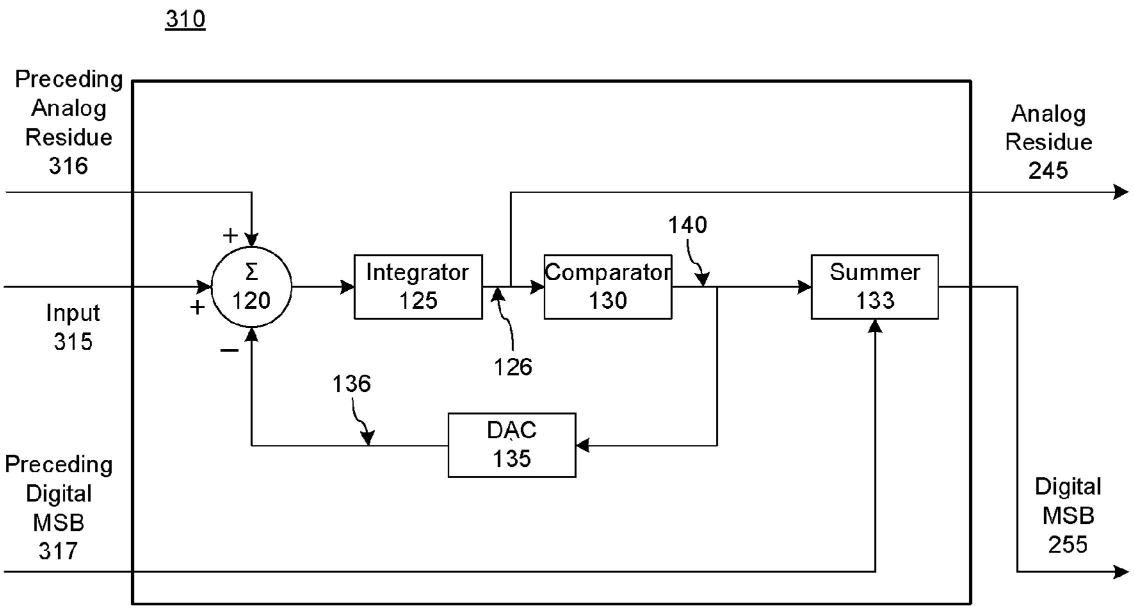
FIG. 3 shows a quantizer having inputs/outputs for digital most-significant-bits and input/outputs for an analog residue.

FIG. 3 shows a block diagram of quantizer 310 configured to receive digital MSB's and analog residue from a preceding quantization stage, e.g., quantizer 210 or quantizer 310. Furthermore, in an embodiment, quantizer 310 can be configured to provide analog residue 245 and digital MSB's 255 to a successive quantizer 310. By arranging multiple quantizers 310 in a series arrangement, multiple quantization stages for A/D conversion can be provided.

In an embodiment, quantizer 310 is initialized to preceding digital MSB's 317, and to preceding analog residue 316. In particular, summer 133 can receive preceding digital MSB's 317, and summation node 120 can receive preceding analog residue 316. Therefore, the integration and quantization of analog signal 315 can be continued from the preceding quantization stage.

Multiple quantization stages comprising quantizer 310 may be provided in applications which require multiple exposures, e.g. extended video exposures. For example, video images are typically provided at a specified frame rate, e.g., 30 frames per second. As a result, the length of conventional exposures can at most be the reciprocal of the frame rate, e.g. 1/30 of a second. This limits the quality of images of dark scenes captured by conventional image sensors. However, the length of an exposure can be extended past 1/30 of a second provided that a new frame is available for recording every 1/30 of a second.

For example, each of a series of quantizers 310 can be configured to integrate analog signal 315 for 1/30 of a second. A new frame can be generated by accessing digital MSB's 255 and analog residue 245 after each quantization stage. In addition, it is possible to continue integration of analog signal 315 generated by each photodiode across successive quantization stages. Accordingly, it is possible to provide higher image quality and dynamic range. In practice, the duration of exposure is limited only by the capacity of summer 133 and by blur caused by movement of the scene.

Quantizers 310 can also integrate multiple exposures which have been shifted relative to one another. This may occur, for example, when an image sensor is configured to perform TDI. TDI is used to improve the quality of captured images when there is relative movement between the image sensor and the subject. Common applications of TDI include commercial earth imaging, astronomy, drift-scanning, and imaging of traffic and assembly lines. Conventionally, short exposure periods are used so that the subject appears stationary for the duration of the exposure. However, the short exposure period can cause underexposure and loss of contrast. Attempting to use longer exposure periods can cause blurring of the subject.

In contrast, TDI eliminates the relative motion between the subject and the pattern of charge generated by the subject in the image sensor. In particular, the pattern of charge in the image sensor can be shifted to compensated for the movement of the subject across the image sensor array. By shifting the pattern of charge at a rate which corresponds to the rate of relative motion between the image sensor and the subject, the motion of the subject can be fixed relative to the pattern of charge in the image sensor. As a result, it is possible to capture higher quality images since longer exposure periods can be used for capturing more light from the subject.

Figure 4:
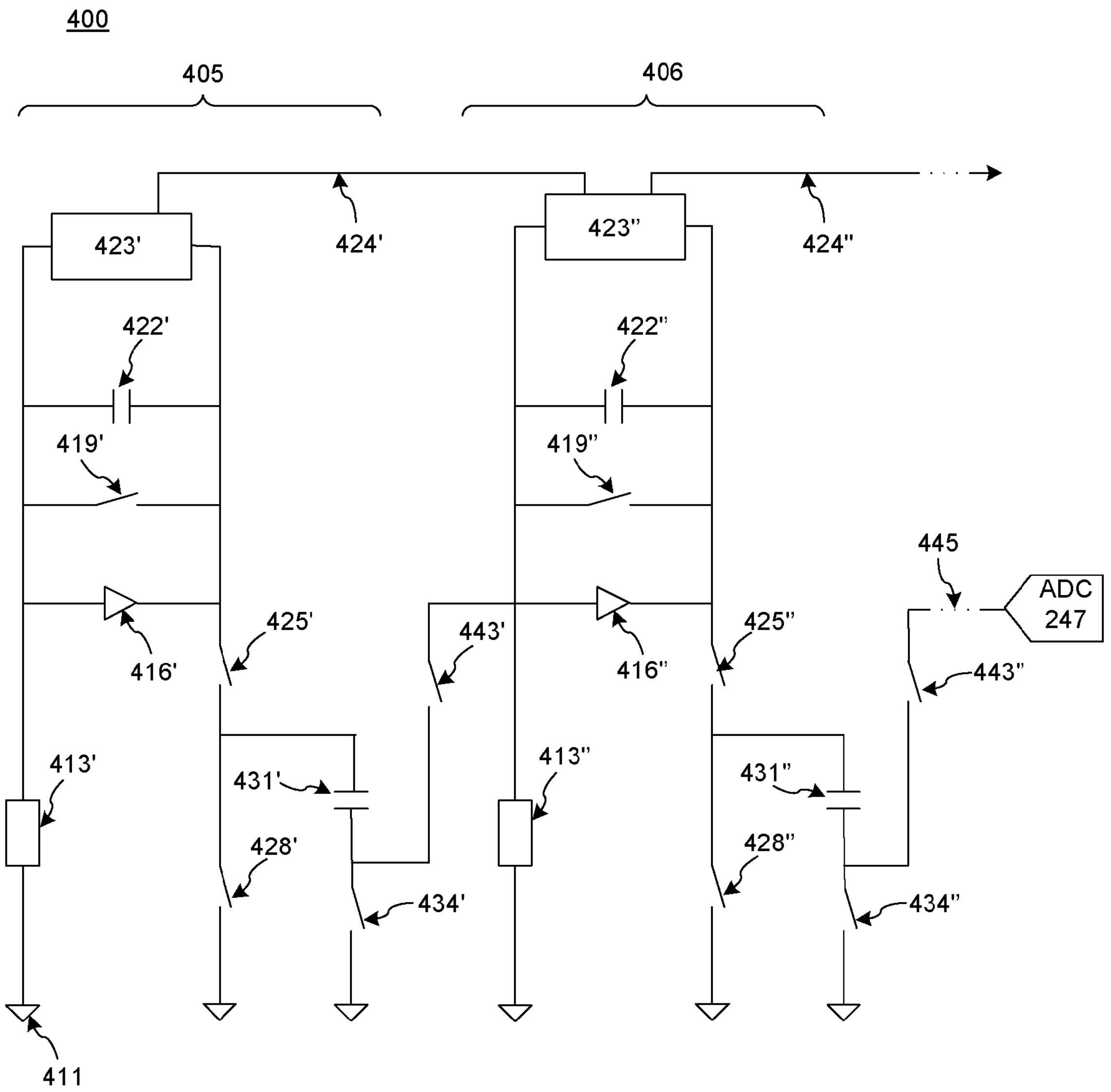
FIG. 4 shows a quantizer capable of performing time-delay integration.

FIG. 4 shows a multi-stage quantizer 400 for A/D conversion with analog residue in a possible TDI imaging implementation. In an embodiment, multi-stage quantizer 400 may comprise first quantizer 405 in series arrangement with second quantizer 406. Ellipse 445 indicates that second quantizer 406 can be followed by ADC 247, as shown in FIG. 4, or by additional quantizers 406. In an embodiment, multi-stage quantizer 400 can comprise an integrating transimpedance amplifier. An implementation of an integrating transimpedance amplifier is described in U.S. Pat. No. 4,786,831, hereby incorporated by reference.

First quantizer 405 and second quantizer 406 include elements which have similar structure and functionality. Accordingly, prime notation (i.e., ' and ") is used to denote a particular element of a group of equivalent elements. In addition, an element number without one or more primes is intended to represent all elements of a group of equivalent elements. For example, 413' and 413" refer to two different photodetectors individually, whereas 413 refers to all photodetectors collectively.

Photodetector 413 can be a photodiode or phototransistor, for example, which generates charge in proportion to the intensity of light incident on the photodetector. Photodetector 413 may be connected between voltage potential 411, e.g. ground, and amplifier 416. Amplifier 416 amplifies the analog signal generated by photodetector 413. Integration capacitor 422 stores the charge associated the amplified analog signal.

Integration capacitor 422 can have a small capacity since the analog signal is continuously converted into the digital domain. As a result, integration capacitor 422 can have a large voltage swing for a given amount of charge and an improved signal to noise ratio. In an embodiment, capacitor reset switch 419' is closed to discharge integration capacitor 422' during time $T_1$. Capacitor reset switch 419' is opened during time $T_2$ in preparation to perform an exposure. The analog residue sampling switch 425' is closed and integration capacitor 422' integrates the charge generated by photodetector 413' during time $T_3$. Also during time $T_3$, quantizer 423' (e.g., comprising integrator 125, comparator 130, summer 133, and DAC 135) generates digital MSB's.

The analog residue remaining after quantization of integration capacitor 422' can be isolated on analog residue capacitor 431' after the integration period ends by opening analog residue sampling switch 425' during time $T_4$. Quantizer sampling switch 443' and analog residue reset switch 428' can be closed during time $T_5$ to transfer analog residue to integration capacitor 422", and residue reset switch 428' can remain closed until the next exposure. In addition, quantizer 405 can shift digital MSB's to quantizer 406 via output 424'. TDI can be performed if the digital MSB's and analog residue are conveyed to successive quantizer stages at a rate which offsets the rate of relative motion between the image sensor and the subject by fixing the motion of the subject relative to the pattern of charge in the image sensor. Quantizer sampling switch 443' can be opened during time $T_6$ to isolate integration capacitor 422" after it has received the analog residue. Analog residue reset switch 434' can be closed during time $T_7$ to reset analog residue capacitor 431'. Analog residue reset switches 428' and 434' can be opened during time $T_8$ in preparation for another exposure.

Accordingly, the digital MSB's and analog residue can be passed to successive quantizer stages for continued integration of an analog input signal. The final quantizer, e.g. quantizer 406 (as shown in FIG. 4), outputs the analog residue to ADC 247 for A/D conversion. A high resolution ADC 247 is not required since the range of the analog residue is limited to a value less than the threshold voltage. The digital MSB's are combined with the LSB's generated by ADC 247 to produce a final digital value of the analog input value. The dynamic range of the final digital value is determined by the product of the possible MSB's and the ADC resolution of the analog residue. For example, if there are eight MSBs and ADC 247 has eight bits of resolution, then the final digital value has a 16 bit dynamic range.

Figure 5A:
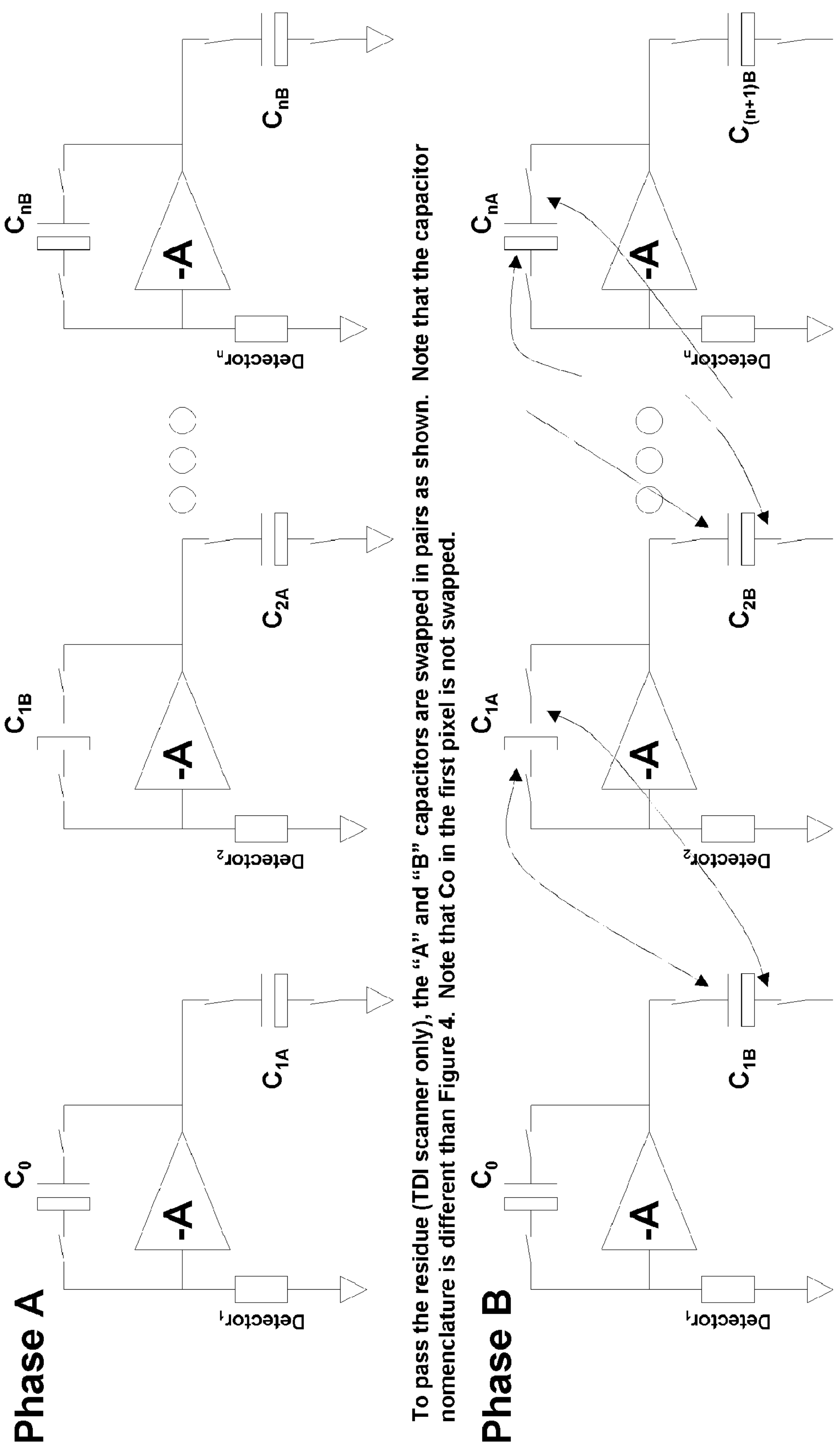

Although FIG. 4 has been described in terms of processing an analog residue, alternative circuits for switching such an analog signal may be used. For example, FIGS. 5A through 5C schematically illustrate other exemplary circuit configurations. FIG. 5A depicts a capacitive transimpedance amplifier (CTIA) that physically switches an integrating capacitor and an analog residue capacitor between neighboring stages during charge transfer phases A and B; FIG. 5B schematically illustrates another CTIA implementation which may be used to temporarily switch an analog residue capacitor of a preceding stage to the input of a following stage; and FIG. 5C depicts a direct injection circuit implementation which switches integration capacitors in adjacent stages. Such switching of components may be carried out in a known manner by use of MOSFET switches integrated onto a substrate, for example.

While particular embodiments of this disclosure have been described, it is understood that modifications will be apparent to those skilled in the art without departing from the spirit of the inventive concept. For example, in addition to integrating transimpedance amplifiers, it is also possible to use direct injection and source-follower implementations. The scope of the inventive concept is not limited to the specific embodiments described herein. Other embodiments, uses, and advantages will be apparent to those skilled in art from the specification and the practice of the claimed invention.

We claim:

1. A signal processor, comprising:

a signal processing unit comprising:

an analog input configured to receive an analog input signal;

a quantizer configured to quantize the received analog input signal into an integer number determined with respect to a predetermined value, and to output the integer number; and an analog output configured to provide an analog residue associated with the quantized analog input signal, wherein an integer number of a preceding signal processing unit is summed with the outputted integer number of the signal processing unit, and an analog residue from the preceding signal processing unit is summed with the analog input signal received by the analog input.

2. The signal processor of claim 1, the signal processing unit further comprising:

a summer configured to determine a sum of integer numbers outputted by the quantizer.

3. The signal processor of claim 2, the summer comprising a counter.

4. The signal processor of claim 1, the quantizer comprising a delta-sigma quantizer.

5. The signal processor of claim 1, the signal processing unit further comprising:

an integrator configured to integrate both the summed received analog input signal and the analog residue from the preceding signal processing unit;

wherein the quantizer is configured to determine whether the integrated analog input signal summed with the analog residue from the preceding signal processing unit is greater than or equal to a threshold value and to output an integer number based on the determination; and a subtractor configured to subtract an analog value from the analog input signal based on the integer number outputted by the quantizer.

6. The signal processor of claim 5, the quantizer comprising a comparator configured to determine whether the integrated analog input signal summed with the analog residue from the preceding signal processing unit is greater than or equal to the threshold value.

7. The signal processor of claim 5, further comprising:

a digital-to-analog converter configured to convert the integer number to the analog value.

8. The signal processor of claim 1, wherein the signal processing unit is configured to receive a sum of integer numbers from the preceding signal processing unit, and to provide a sum of integer numbers to a successive signal processing unit.

9. The signal processor of claim 1, wherein the analog residue provided by the analog output is equal to the analog input signal when the magnitude of the analog input signal is less than the predetermined value.

10. The signal processor of claim 1, wherein the integer number outputted by the quantizer is associated with the most significant bits of the analog input signal, and the analog residue is associated with the least significant bits of the analog input signal.

11. The signal processor of claim 1, further comprising:

an analog-to-digital converter configured to convert an analog residue from a last signal processing unit in a sequential series of one or more signal processing units into a first digital value; and wherein the signal processor is configured to output a second digital value based on a sum of integer numbers and the first digital value outputted by the analog-to-digital converter.

12. The signal processor of claim 1, wherein the signal processing unit is configured to process an analog input signal generated by a photodetector in an image sensor.

13. The signal processor of claim 12, wherein the signal processing unit is configured to perform time-delay-integration by receiving a plurality of individual exposures of a moving object detected by the photodetector in the image sensor, wherein the signal processing unit compensates for relative motion between the image sensor and the moving object by shifting and combining image date for each of the plurality of individual exposures.

14. A method for processing an analog signal using a multistage converter, the method comprising:

receiving the analog signal in one stage of the multistage converter;

summing the analog signal with a preceding analog residue from a preceding stage of the multistage converter;

quantizing the analog signal summed with the preceding analog residue into an integer number determined with respect to a predetermined value;

outputting the integer number; and outputting a different analog residue associated with the quantized analog signal summed with the preceding analog residue.

15. The method of claim 14, wherein the different analog residue outputted is equal to the analog signal when the magnitude of the analog signal is less than the predetermined value.

16. The method of claim 14, the quantizing further comprising summing integer numbers to determine an integer value.

17. The method of claim 16, further comprising:

receiving, in said one stage, an integer value of preceding summed integer numbers from the preceding stage of the multistage converter; and summing the integer value of preceding summed integer numbers with the integer number outputted.

18. The method of claim 16, wherein the integer value is associated with the most significant bits of the analog signal, and the analog residue is associated with the least significant bits of the analog signal.

19. The method of claim 16, further comprising:

converting the different analog residue to a digital value; and combining the integer value and the digital value of the different analog residue in a succeeding stage of the multistage converter.

20. The method of claim 14, further comprising:

integrating at least a portion of the analog signal;

the quantizing comprising determining whether the integrated analog signal is greater than or equal to a threshold value and outputting the integer number based on the determination; and subtracting an analog value from the analog signal based on the integer number.

21. The method of claim 20, further comprising:

performing a digital-to-analog conversion to convert the integer number to the analog value.

22. The method of claim 14, further comprising generating the analog signal with an array of photodetectors of an image sensor.

23. The method of claim 22, further comprising generating the analog signal with an image sensor configured to perform time-delay-integration, said image sensor receiving a plurality of individual exposures of a moving object detected by the array of photodetectors in the image sensor, said image sensor compensating for relative motion between the image sensor and the moving object by shifting and combining image date for each of the plurality of individual exposures.

24. An image sensor, comprising:

an array of photodetectors;

an analog input configured to receive an analog signal generated by a photodetector;

a quantizer configured to quantize the analog signal into an integer number associated with a predetermined value, and to output the integer number; and an analog output configured to provide an analog residue of the quantized analog signal, wherein an integer number associated with a preceding photodetector is summed with an integer number associated with a successive photodetector, and an analog residue from the preceding photodetector is summed with an analog signal of the successive photodetector.

25. The image sensor of claim 24, wherein the analog residue provided by the analog output is equal to the analog signal when the analog input signal is less than the predetermined value.

26. The image sensor of claim 24, wherein the integer number outputted by the quantizer is associated with the most significant bits of the analog signal, and the analog residue is associated with the least significant bits of the analog signal.

27. The image sensor of claim 24, further comprising a summer configured to determine a sum of integer numbers outputted by the quantizer.

28. The image sensor of claim 27, the summer comprising a counter.

29. The image sensor of claim 24, wherein a quantizer and an analog output of the analog residue is associated with each photodetector of the array of photodetectors.

30. The image sensor of claim 27, further comprising:

an integrator configured to integrate the analog signal received from the analog input;

wherein the quantizer is configured to determine whether the integrated analog signal is greater than or equal to a threshold value and to output an integer number based on the determination; and a subtractor configured to subtract an analog value from the analog signal based on the integer number outputted by the quantizer.

31. The image sensor of claim 30, further comprising a comparator for determining whether the integrated analog signal is greater than or equal to the threshold value.

32. The image sensor of claim 30, further comprising:

a digital-to-analog converter configured to convert the integer number to the analog value.

33. The image sensor of claim 27, wherein the summer is configured to either receive a sum of integer numbers associated with a preceding photodetector, or to provide a sum of integer numbers to a summer associated with a successive photodetector, or both.

34. The image sensor of claim 27, further comprising:

an analog-to-digital converter configured to convert an analog residue from a last photodetector in a sequential series of photodetectors to a digital value; and an image processor configured to output a digital value based on a sum of integer numbers and the digital value outputted by the analog-to-digital converter.

35. The image sensor of claim 24, wherein the image sensor is configured to perform time-delay-integration by receiving a plurality of individual exposures of a moving object detected by the array of photodetectors, wherein a signal processing unit compensates for relative motion between the image sensor and the moving object by shifting and combining image date for each of the plurality of individual exposures.

* * * * *